United States Patent
Irscheid et al.

(10) Patent No.: US 7,190,932 B2
(45) Date of Patent: Mar. 13, 2007

(54) CIRCUIT ARRANGEMENT FOR A PREDISTORTED FEEDBACK COUPLING FROM A TRANSMITTER TO A RECEIVER IN A MULTI-MODE MOBILE TELEPHONE

(75) Inventors: Otmar Irscheid, Hawalli (KW); Andreas Langer, Unterschleissheim-Lohhof (DE); Jürgen Vollmer, Bocholt (DE)

(73) Assignee: Siemens Aktiengesellschaft, Munich (DE)

( * ) Notice: Subject to any disclaimer, the term of this patent is extended or adjusted under 35 U.S.C. 154(b) by 217 days.

(21) Appl. No.: 10/507,465

(22) PCT Filed: Aug. 6, 2003

(86) PCT No.: PCT/DE03/02642

§ 371 (c)(1),
(2), (4) Date: Sep. 10, 2004

(87) PCT Pub. No.: WO2004/070942

PCT Pub. Date: Aug. 19, 2004

(65) Prior Publication Data
US 2005/0113132 A1 May 26, 2005

(30) Foreign Application Priority Data
Jan. 16, 2003  (DE)  ................ 103 01 499

(51) Int. Cl.
*H04B 1/44* (2006.01)
(52) U.S. Cl. .............. 455/78; 455/82; 455/83
(58) Field of Classification Search ........... 455/78, 455/82, 83, 88, 63.1, 67.11, 67.13, 114.3; 375/296, 346
See application file for complete search history.

(56) References Cited

U.S. PATENT DOCUMENTS 6,552,609 B2 *  4/2003  Hamada et al. ............. 330/149

(Continued)

FOREIGN PATENT DOCUMENTS

DE  2002342756  *  3/2002

(Continued)

OTHER PUBLICATIONS

Patent Abstracts of Japan—08204605-809-96.

*Primary Examiner*—Lana Le
*Assistant Examiner*—Perez Angelica
(74) *Attorney, Agent, or Firm*—Bell, Boyd & Lloyd LLP

(57) ABSTRACT

A circuit arrangement for a multimode mobile telephone that transmits and receives signals to and from various mobile radio networks contains a baseband and a transceiver unit. The transceiver unit includes a digital adaptive predistorter having a switching element. The switching element is arranged so that an optional connection is created. The optional connection connects an amplifier output to an input of a receiver causing that receiver input to be disconnected from an antenna changeover switch. This way, it is possible for the receiver to be disconnected from a transmitting and receiving antenna during periods when the receiver is not receiving signals from the transmitting and receiving antenna. While the receiver is disconnected from the transmitting and receiving antenna, the receiver is able to receive other signals. By using a simple switch the receiver can be disconnected from the transmitting and receiving antenna, and at the same time establish a connection between the output of the transmitter amplifier and the input of the receiver. By doing so, the receiver is able to tap off and detect signals at the output of the transmitter amplifier.

4 Claims, 2 Drawing Sheets

U.S. PATENT DOCUMENTS 7,035,345 B2 * 4/2006 Jeckeln et al. ............... 375/296
7,047,042 B2 * 5/2006 Komara et al. ............. 455/561

FOREIGN PATENT DOCUMENTS

| EP | 0700169 A2 * | 3/1996 |
| EP | 0 715 420 | 6/1996 |
| EP | 0 928 072 | 7/1999 |
| EP | 1 014 591 | 6/2000 |
| EP | 1 067 676 | 1/2001 |
| EP | 1 217 757 | 6/2002 |
| JP | 8-204605 | 8/1996 |
| WO | WO 01/99298 | 12/2001 |

* cited by examiner

CIRCUIT ARRANGEMENT FOR A PREDISTORTED FEEDBACK COUPLING FROM A TRANSMITTER TO A RECEIVER IN A MULTI-MODE MOBILE TELEPHONE

BACKGROUND

The present disclosure relates to circuit arrangements for a multimode mobile telephone for transmitting/receiving signals to/from various mobile radio networks.

In many fields, such as with multimode mobile telephones, a linear signal amplification with a high output efficiency is required. One way of achieving a linear signal amplification is to combine a non-linear power amplifier (PA) that has a non-linear curve, with a predistorter. The predistorter distorts the input signals so that the complete system consisting of a predistorter and nonlinear power amplifier again has a substantially more linear behavior than just a power amplifier. This method of application is known as predistortion. The combination of the predistorter curve of the input signal and the non-linear amplification curve results overall in a linear curve of the transmitting system and thus a linear signal amplification. One problem with this method of application occurs due to the ageing of components or the temperature-dependence of components. The effects of such phenomena change the linearity of the transmission system.

To correct these undesirable effects using digital adaptive predistortion, the envelope of the amplified signal is regained with the aid of a measuring branch, or feedback branch. The curve of the predistorter is accordingly adapted. The feedback branch consists mainly of a coupler, a demodulator and an analog-digital converter (ADC).

A disadvantage of this method of digital adaptive predistortion is that the feedback branch involves additional cost, installation space and power consumption. For this reason, no linearization methods for power amplifiers requiring a complex feedback branch have so far been realized in commercial systems.

SUMMARY

It The present disclosure teaches a circuit arrangement for a multimode mobile telephone that enables digital adaptive predistortion, without using additional hardware components for the feedback branch.

The Existing hardware components of an exemplary circuit arrangement for a multimode mobile telephone are not continually used for their intended tasks, and on the other hand, that these existing hardware components are also suitable for functioning as a feedback branch in the context of digital adaptive predistortion.

In one exemplary embodiment, a circuit arrangement for a multimode mobile telephone that transmits and receives signals to and from various mobile radio networks contains a baseband and a transceiver unit. The baseband includes at least two analog to digital converters and at least one digital to analog converter. The transceiver unit includes at least two receivers and at least one transmitter amplifier. The transceiver also includes a antenna changeover switch and a transmitting and receiving antenna. An output of each receiver is connected to one of the analog to digital converters. The digital to analog converter is connected to an input of the transmitter amplifier. The antenna changeover switch is connected to the inputs of the two receivers and to the output of the transmitter amplifier. The antenna changeover switch is also connected to the transmitting and receiving antenna.

One element of this exemplary embodiment is a digital adaptive predistorter having a switching element. The switching element is arranged so that an optional connection is created. The optional connection connects the amplifier output to one of the receiver inputs causing that receiver input to be disconnected from the antenna changeover switch. This way, it is possible for the receiver to be disconnected from the transmitting and receiving antenna during periods when the receiver is not receiving signals from the transmitting and receiving antenna. While the receiver is disconnected from the transmitting and receiving antenna, the receiver is able to receive other signals. By using a simple switch the receiver can be disconnected from the transmitting and receiving antenna, and at the same time establish a connection between the output of the transmitter amplifier and the input of the receiver. By doing so, the receiver is able to tap off and detect signals at the output of the transmitter amplifier.

Under a preferred embodiment, at least one switch element is arranged in the antenna changeover switch. Under this configuration, a separation of the transmitted and received signals with regard to frequency and time takes place in the antenna changeover switch. Certain switching functions are integrated into the antenna changeover switch for these tasks. Additional integration of the switch element in the antenna changeover switch may also be performed without deviating from the spirit and scope of the invention.

If a first receiver receives signals transmitted from a UMTS network and a second receiver, of which there is at least one, receives signals transmitted from a GSM network, the first receiver can always be available for reception from the UMTS network. The second receiver, which monitors the GSM network periodically, measures the signal at the transmitter amplifier output at the time in which no signals are received from the GSM network. Accordingly, the second receiver would meet the requirements for a UMTS predistortion and also for GSM reception. In this way, the existing hardware components, that at certain times are not used, can be more effectively utilized and no additional hardware components, involving extra cost and installation space, need to be fitted in the circuit arrangement.

Additional features and advantages of the invention are given in the following description of preferred exemplary embodiments, with reference to the drawings.

DETAILED DESCRIPTION

Figure 1:
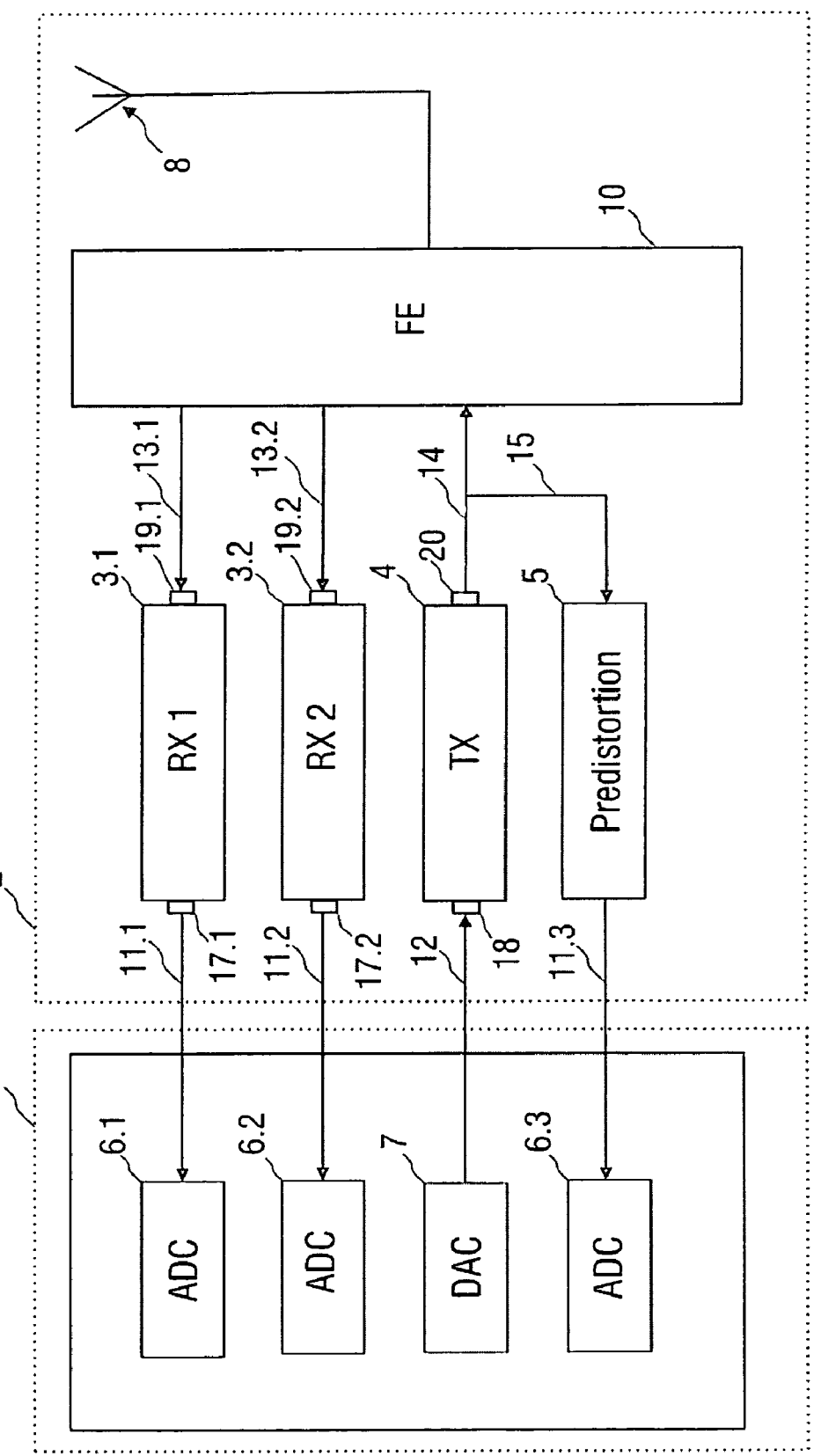
FIG. 1 illustrates a prior art circuit arrangement for multimode mobile telephones in which a digital adaptive predistortion is performed with the aid of a feedback branch.

FIG. 1 shows a known circuit arrangement for multimode mobile telephones, in which digital adaptive predistortion is performed with the aid of a feedback branch 5. This circuit arrangement consists of a transceiver unit 2 and a unit designated as baseband 1, in which the signal predistortion necessary for the digital adaptive predistortion method takes place.

The transceiver unit 2, shown in FIG. 1 by a box with a dotted frame, consists of a transmitting and receiving antenna 8 that, by means of an antenna changeover switch 10, has connections 13.1, 13.2 and 14 coupled to inputs 19.1 and 19.2 of both receivers (RX 1 and RX 2) 3.1 and 3.2, and to output 20 of the transmitter amplifier (TX) 4. In this embodiment, the receiver 3.1 (RX 1) and the transmitter amplifier 4 (TX) communicate with the UMTS network. The communication follows the FDD-UMTS (Frequency Division Duplex-Universal Mobile Telecommunication System) standard, whereby several frequency bands are used. The several frequency bands provides for simultaneous transmitting and receiving of signals on the various frequency bands, as well as modulation of the amplitude and phase of the signals. The GSM (Global System Mobile) network is monitored by receiver 3.2 (RX 2). In the GSM network, the signals are transmitted in time slots, and are phase-modulated using the time-division multiplex method. Unlike FDD-UMTS, simultaneous transmission and reception of signals is not possible in the GSM network. The frequency and timing of the signals transmitted and received via the transmitting and receiving antenna 8 can be separated by means of the antenna changeover switch 10.

Baseband 1 is shown within the dotted box on the left in FIG. 1. Baseband 1 has a total of three analog-digital converters 6.1 to 6.3 and a digital-analog converter 7. Both top analog-digital converters 6.1 and 6.2 each receive analog signals via connections 11.1 and 11.2 transmitted from the outputs 17.1 and 17.2 of the first and second receivers (RX 1 and RX 2) 3.1 and 3.2. In order to be able to perform digital adaptive predistortion with this circuit arrangement, the lowest digital-analog converter 7 is provided in baseband 1 that transmits the predistorted signals via connection 12 to the input 18 of the transmitter amplifier 4 (TX).

To obtain linear signal amplification under the arrangement of FIG. 1, a predistorted signal fed in via connection 12 to input 18 of the transmitter amplifier (TX) 4 and predistorted must be tapped off at output 20 of the transmitter amplifier (TX) 4 and compared with the fed-in signal.

A measuring branch 15, is provided at the output 20 of the transmitter amplifier (TX) 4. This measuring branch, also known as a feedback branch 5, uses the lowest analog-digital converter 6.3. By comparing the signal fed in at input 18 with the signal output at output 20, non-linearities of the signal amplification can be detected and subsequently corrected.

Figure 2:
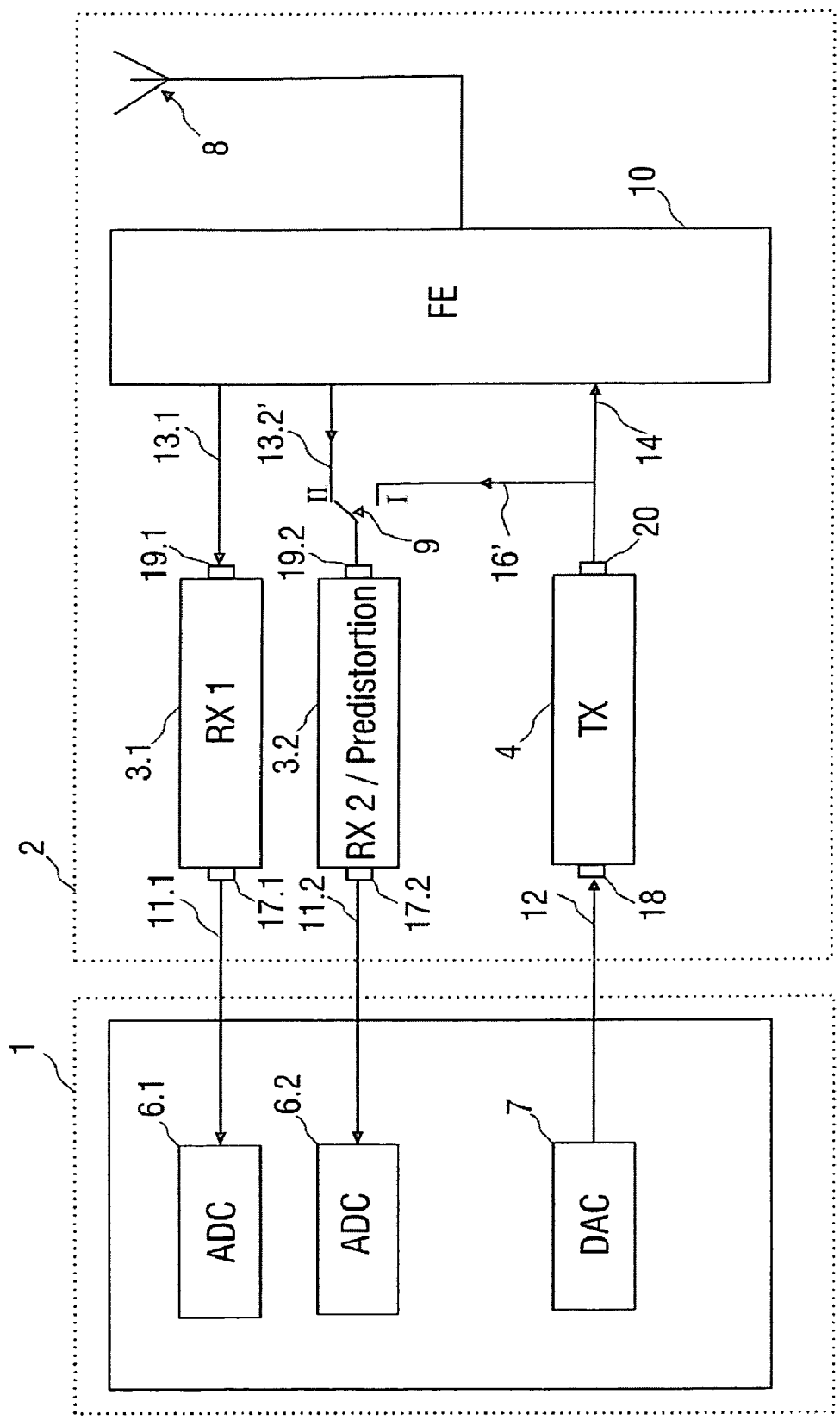
FIG. 2 is a circuit arrangement for multimode mobile telephones in which digital adaptive predistortion is performed with one of two receivers.

FIG. 2 shows a different circuit arrangement for multimode mobile telephones in which a digital adaptive predistortion can be performed with one receiver (RX 2) 3.2 from two available receivers (RX 1 and RX 2) 3.1 and 3.2. Similar to FIG. 1, the circuit arrangement of FIG. 2 comprises a transceiver unit 2 and a unit designated as baseband 1.

The transceiver unit 2 comprises a transmitting and receiving antenna 8 that has connections 13.1, 13.2 and 14 coupled to inputs 19.1 and 19.2 of the receivers (RX 1 and RX 2) 3.1 and 3.2 via changeover switch 10 and further to the output 20 of the transmitter amplifier (TX) 4. Under this configuration, the receiver 3.1 (RX 1) and the transmitter amplifier 4 (TX) can effectively communicate with the UMTS network, under the FDD-UMTS (Frequency Division Duplex-Universal Mobile Telecommunication System) standard, whereby several frequency bands are used. By using several frequency bands, simultaneous transmission and reception of signals on different frequency bands is possible, and modulation of the amplitude and phase of the signals can occur. A GSM (Global System Mobile) network is monitored by the second receiver 3.2 (RX 2). Under the GSM network, the signals are transmitted in time slots, and phase-modulated using the time-division multiplex method. Simultaneous transmission and reception of signals is not possible under the GSM network. By means of the antenna changeover switch 10, the signals received and transmitted via the transmitting and receiving antenna 8 are separated with respect to frequency and time.

In contrast to FIG. 1, no separate feedback branch 5 is provided in the circuit arrangement of FIG. 2 the output of the transmitter amplifier (TX) 4 for monitoring the signal at the output 20 of the transmitter amplifier (TX) 4. The absence of the feedback branch 5 can mean that the analog-digital converter 6.3 (lowest ADC from FIG. 1) in the baseband 1 that was previously necessary can now be omitted.

Referring to FIG. 2, switch 9 is coupled to the circuit arrangement to enable the detection of the signal at output 20 of the transmitter amplifier (TX) 4. When the switch 9 is in switch setting II, the input 19.2 of the receiver (RX 2) 3.2 is connected, via the optional connection 13.2', to the antenna changeover switch 10 and the transmitting and receiving antenna 8. The GSM network can thus be monitored in switch setting II. As described above, in the GSM network the signals are transmitted in time slots, phase-modulated using the time-division multiplex method.

That means that it is now possible in these time slots, in which no GSM signals are transmitted, to input 19.2 of the receiver (RX 2) 3.2, and to use receiver (RX 2) 3.2 to monitor the signals at output 20 of the transmitter amplifier (TX) 4. To do this, the switch 9 is moved to switch setting I these time slots, creating connection 13.2' between the second receiver (RX 2) 3.2 and the antenna changeover switch 10. Changeover switch 10 is disconnected and at the same time the optional connection 16' from the output 20 of the transmitter receiver (TX) 4 to the input 19.2 of the second receiver (RX 2) 3.2 is established. The second receiver (RX 2) 3.2 and the analog-digital converter 6.2 now function as a feedback branch.

The above disclosure illustrates a circuit arrangement for a multimode mobile telephone that enables digital adaptive predistortion to be carried out. In contrast to the prior art discussed above, the disclosed circuit arrangement does not require an additional measuring branch to measure the amplified signal, but instead utilizes existing hardware components of the circuit arrangement, and are switched in such a way that they have the same function as the measuring branch. Depending on the switch setting of the switching element, the second receiver is suitable for, for example, performing a UMTS predistortion and also suitable for GSM reception.

In addition, although the invention is described in connection with mobile telephones, it should be readily apparent that the invention may be practiced with any type of communicating device, such as a personal assistant or even a PC-enabled device. It is also understood that the system devices described in the embodiments above can substituted with equivalent devices to perform the disclosed methods and processes. Accordingly, the invention is not limited by the foregoing description or drawings, but is only limited by the scope of the appended claims.

The invention claimed is:

1. A circuit arrangement for a multimode mobile telephone comprising:
   a baseband comprising a first analog to digital converter, a second analog to digital converter and a digital to analog converter;

a transceiver unit comprising a first receiver, a second receiver, an amplifier, an antenna changeover switch, and a receiving antenna, an output of the first receiver being connected to the first analog to digital converter, an output of the second receiver being connected to the second analog to digital converter, an input of the amplifier being connected to the digital to analog converter, an input of the first receiver being connected to the antenna changeover switch, an input of the second receiver being connected to the antenna changeover switch, an output of the amplifier being connected to the antenna changeover switch, and the antenna changeover switch being connected to the receiving antenna, wherein the second receiver provides a feedback branch using digital adaptive predistortion; and a switching element that creates an optional connection by connecting the amplifier output to the second receiver input whereby the second receiver input is disconnected from the antenna changeover switch.

2. The circuit arrangement of claim 1, wherein said switching element is arranged in the antenna changeover switch.

3. The circuit arrangement of claim 1, wherein the first receiver is designed to receive signals from the UMTS network.

4. The circuit arrangement of claim 1, wherein the second receiver is designed to receive signals from the GSM network.

* * * * *